(12) United States Patent
Kahlman

(10) Patent No.: US 7,430,239 B2
(45) Date of Patent: *Sep. 30, 2008

(54) BIT-DETECTION ARRANGEMENT AND APPARATUS FOR REPRODUCING INFORMATION

(75) Inventor: Josephus Arnoldus Henricus Maria Kahlman, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 565 days.

This patent is subject to a terminal disclaimer.

(21) Appl. No.: 10/496,709

(22) PCT Filed: Oct. 24, 2002

(86) PCT No.: PCT/IB02/04486

§ 371 (c)(1),
(2), (4) Date: May 25, 2004

(87) PCT Pub. No.: WO03/047109

PCT Pub. Date: Jun. 5, 2003

(65) Prior Publication Data

US 2005/0018776 A1    Jan. 27, 2005

(30) Foreign Application Priority Data

Nov. 30, 2001  (EP)  .................. 01204622

(51) Int. Cl.
*H04B 14/06* (2006.01)

(52) U.S. Cl. .............. 375/247; 375/340; 341/155; 369/59.2

(58) Field of Classification Search ............. 375/371, 375/327, 126, 247, 354, 355, 375–376, 240, 375/340; 341/126–173; 340/870.21; 360/32, 360/39, 51; 369/47.35, 59.2; 327/157, 159
See application file for complete search history.

(56) References Cited

U.S. PATENT DOCUMENTS

| | | | | |
|---|---|---|---|---|
| 4,568,887 A | * | 2/1986 | Bierhoff | 331/1 R |
| 4,847,876 A | * | 7/1989 | Baumbach et al. | 375/364 |
| 4,912,729 A | * | 3/1990 | Van Rens et al. | 375/327 |
| 5,067,138 A | * | 11/1991 | Van Rens et al. | 375/106 |
| 5,195,110 A | * | 3/1993 | Gorshe | 375/355 |
| 5,291,500 A | * | 3/1994 | Patel et al. | 714/818 |
| 5,337,335 A | * | 8/1994 | Cloetens et al. | 375/376 |
| 5,481,568 A | * | 1/1996 | Yada | 375/340 |
| 5,559,840 A | * | 9/1996 | Melas et al. | 375/355 |
| 5,663,945 A | * | 9/1997 | Hayashi et al. | 369/47.35 |

(Continued)

*Primary Examiner*—Mohammad Ghayour
*Assistant Examiner*—Sophia Vlahos
(74) *Attorney, Agent, or Firm*—Michael E. Belk

(57) ABSTRACT

A preprocessing unit converts an analog signal to a processed signal at a sample rate controlled by a first clock signal. A digital phase locked loop locks on the processed signal and outputs a phase signal using the first clock signal. A bit decision unit outputs a digital signal and a third clock signal using the phase signal, the first clock signal and an output signal from the preprocessing unit. A clock divider produces the first clock signal from the second clock signal. A quantizer produces the output signal by quantizing the analog signal amplitude. A phase detector determines a phase difference between the output signal and the second clock signal to feed an amplitude that indicates a phase difference. A sample and hold unit samples the output signal using the second clock signal and holds samples of the output signal for a clock period of first clock signal.

8 Claims, 7 Drawing Sheets

U.S. PATENT DOCUMENTS

| | | | |
|---|---|---|---|
| 5,838,512 A * | 11/1998 | Okazaki | 360/51 |
| 6,114,879 A * | 9/2000 | Popplewell et al. | 327/3 |
| 6,304,118 B1 * | 10/2001 | Ikeno et al. | 327/159 |
| 6,496,556 B1 * | 12/2002 | Huehne et al. | 377/2 |
| 6,535,044 B2 * | 3/2003 | Kramer | 327/291 |
| 6,608,871 B2 * | 8/2003 | Popplewell et al. | 375/316 |
| 6,970,046 B2 * | 11/2005 | Da Dalt et al. | 331/16 |
| 6,990,163 B2 * | 1/2006 | Williams | 375/376 |
| 2002/0130798 A1 * | 9/2002 | Tonami | 341/118 |
| 2003/0053385 A1 * | 3/2003 | Tobita et al. | 369/47.22 |
| 2003/0174797 A1 * | 9/2003 | Grushin | 375/376 |

* cited by examiner

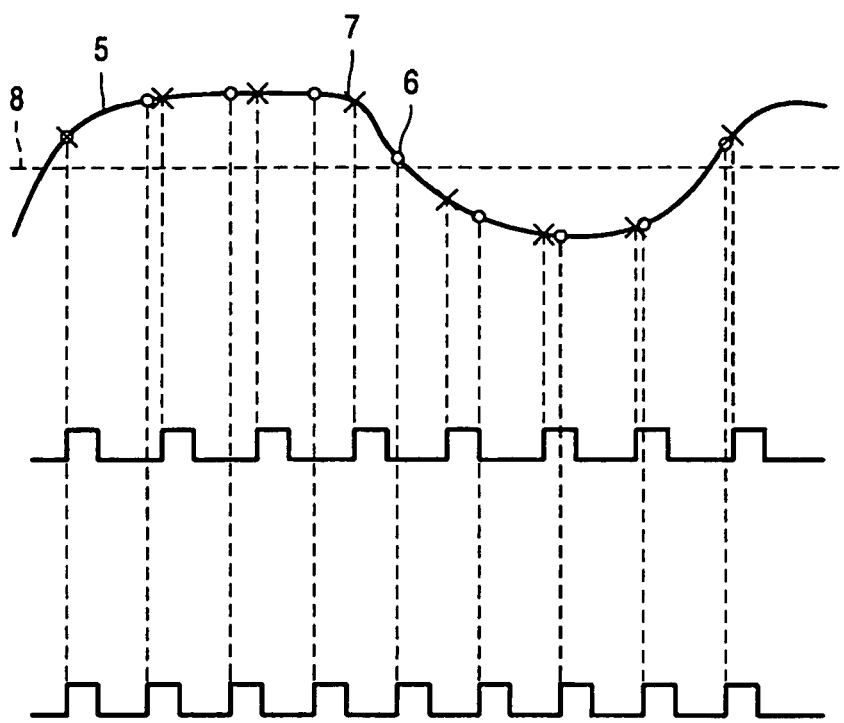
FIG. 2A
FIG. 2B
FIG. 2C
FIG. 2D
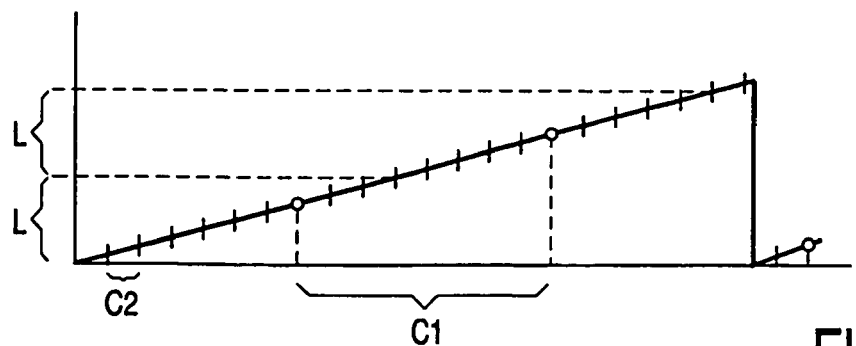
FIG. 3

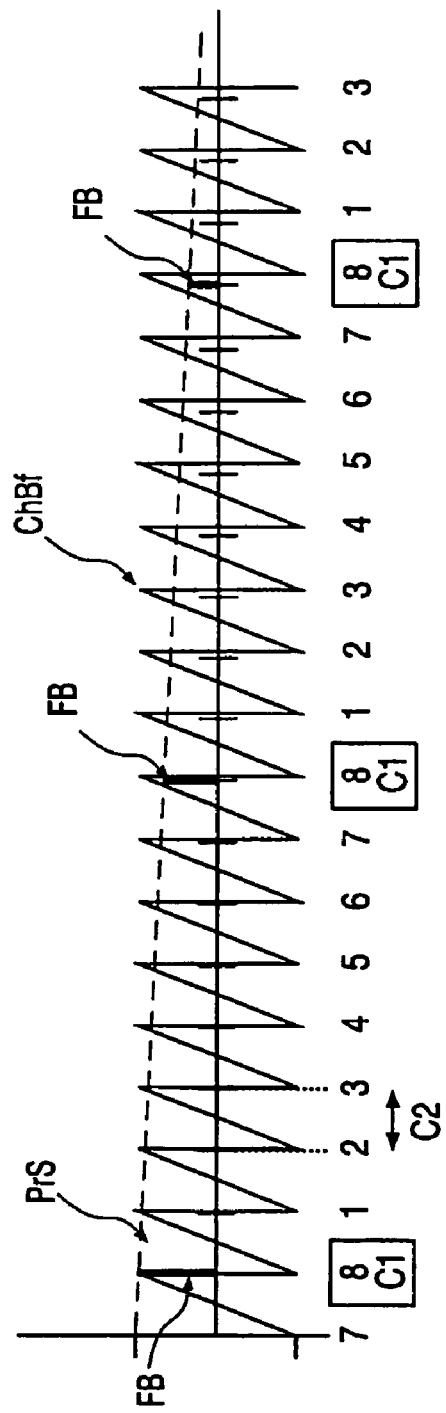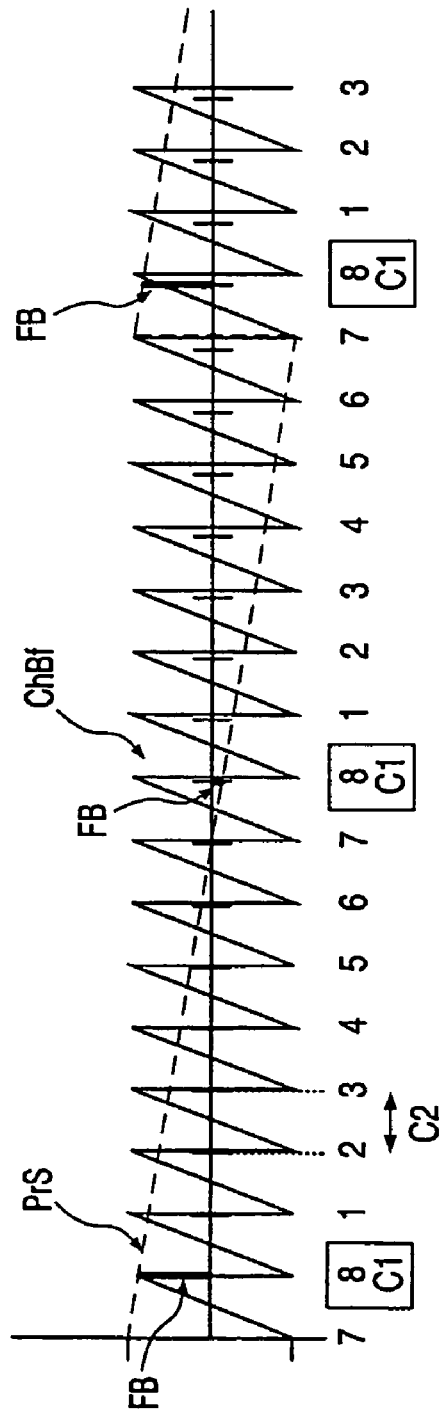

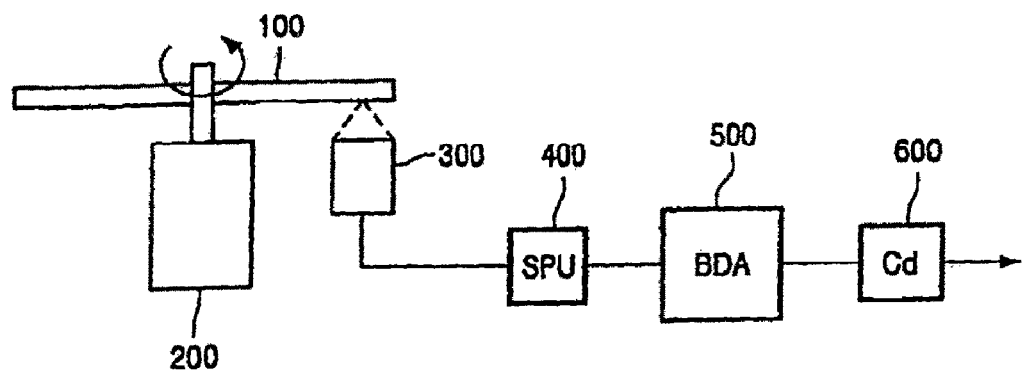
FIG. 11
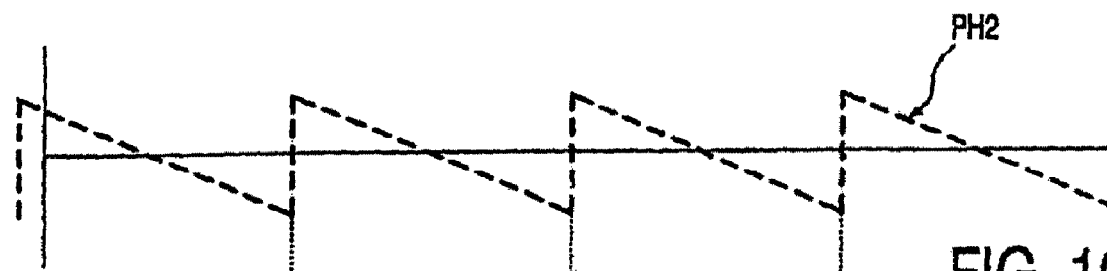
FIG. 10A
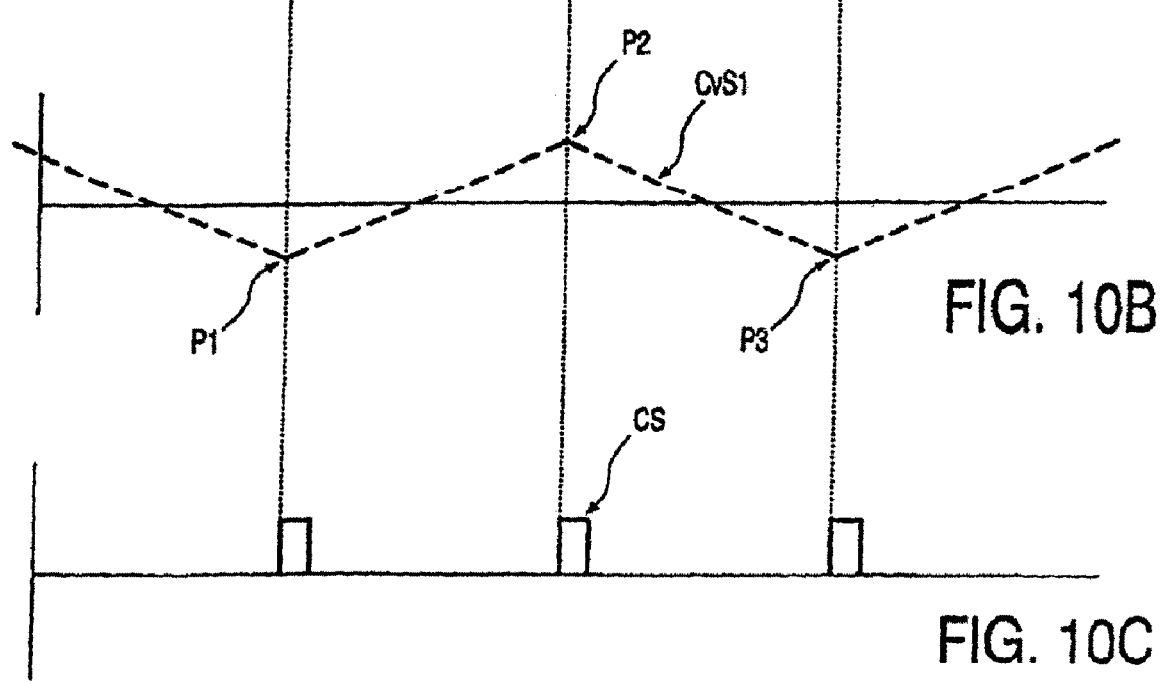
FIG. 10B
FIG. 10C

BIT-DETECTION ARRANGEMENT AND APPARATUS FOR REPRODUCING INFORMATION

The invention relates to a bit-detection arrangement able to convert an analog signal having an amplitude into a digital signal representing a bit sequence from which the analog signal is derived, comprising:

a preprocessing unit able to convert the analog signal into a processed signal suitable for further processing and able to produce an output signal $S_1$, comprising an analog to digital converter ADC which is able to output the processed signal at a sample rate controlled by a clock signal $C_1$;

a digital phase locked loop DPLL able to lock on the processed signal and able to output a phase signal $PH_1$ using the clock signal $C_1$, and a bit decision unit able to output the digital signal and a clock signal $C_3$ using the phase signal $PH_1$, the clock signal $C_1$ and the output signal $S_1$.

The invention also relates to an apparatus for reproducing information on an information carrier having such a bit-detection arrangement.

An embodiment of such a bit-detection arrangement is known from European Patent Application 0342736.

The known bit-detection arrangement converts the analog signal into the processed signal by using the analog to digital converter ADC of the preprocessing unit. The processed signal thus comprises samples of the analog signal. The analog to digital converter ADC is controlled by the clock signal $C_1$, which has a frequency of approximately the bit rate or greater of the bit sequence from which the analog signal is derived. The bits in the bit sequence will hereinafter also be referred to as channel bits. The bit rate of the channel bits in the analog signal will hereinafter also be referred to as the channel bit rate, or the channel bit frequency. The digital PLL is able to output the phase signal $PH_1$ which indicates the channel bit rate. The bit decision unit is able to determine a first crossing with a predetermined level of the phase signal $PH_1$, and is able to output the digital signal by determining a sign of a sample of the analog signal at an instant in time in the neighborhood of the first crossing by using the processed signal. Therefore, in this case, the processed signal is used as signal $S_1$ mentioned in the opening paragraph. The bit decision unit is able to output the clock signal $C_3$ which is synchronous with the digital data. Clock signal $C_3$ is derived from the phase signal $PH_1$. Clock signal $C_3$ is used to clock out the correct bits at the correct moments. The known bit-detection arrangement also comprises an interpolator which determines the phase difference between a zero crossing of the clock signal $C_1$ and a zero crossing of the processed signal. According to this phase difference the phase of the processed signal is corrected and subsequently fed to the digital PLL.

It is apparent that the analog to digital converter ADC has to sample at a rate determined by the channel bit rate. With increasing demands on the channel bit rate, the analog to digital converter ADC also has to sample at increasing rates. It is a drawback of the known bit-detection arrangement that it is not able to process analog signals with relatively high channel bit rates. Furthermore, an analog to digital converter ADC that can sample with relatively high sample rates is relatively expensive. Also the speed at which the digital PLL operates is determined by the channel bit rate, and therefore the demands on the digital PLL become higher with increasing channel bit rates.

It is a first object of the invention to provide a bit-detection arrangement of the kind described in the opening paragraph, that is able to process analog signals with relatively high channel bit rates, and even also at relatively low costs.

It is a second object of the invention to provide an apparatus for reproducing information recorded on an information carrier, which is provided with such a bit-detection arrangement.

The first object is realized in that the bit-detection arrangement further comprises a clock divider able to use a clock signal $C_2$ to produce the clock signal $C_1$ by dividing a frequency of the clock signal $C_2$ by a factor n, where n is an integer greater than one, and the preprocessing unit further comprises:

a quantizer able to produce the output signal $S_1$ by quantizing the amplitude of the analog signal, and a phase detector $PD_1$ able to determine a phase difference $\Delta P_1$ between the output signal $S_1$ and the clock signal $C_2$, and able to feed an output signal $PH_2$ having an amplitude, where the amplitude of $PH_2$ indicates the phase difference $\Delta P_1$, to the analog to digital converter ADC, and the bit decision unit comprising a sample and hold unit able to sample the output signal $S_1$, using the clock signal $C_2$, and to hold n samples, $sample_{y=1}$ to $sample_{y=n}$, of the output signal $S_1$ for a clock period of clock signal $C_1$, n being the division factor of clock signal $C_2$.

The output signal $PH_2$ of the phase detector $PD_1$ has a relatively low frequency if the difference of the frequency of the clock signal $C_2$ and the output signal $S_1$ is relatively small. Therefore the analog to digital converter ADC can sample at a relatively slow rate, and thus the ADC may be a relatively simple and inexpensive one. For this reason the clock signal $C_1$ may have a lower frequency than clock signal $C_2$, in fact clock signal $C_1$ is derived from clock signal $C_2$ by dividing the frequency of clock signal $C_2$ by a factor n. The analog to digital converter ADC is able to use the clock signal $C_1$ to control the sample rate, resulting in the processed signal.

The quantizer quantizes the analog signal. A common used quantizer is a threshold detector. The threshold detector converts the analog signal into a digital signal. If the analog signal is above a predetermined threshold level, then the output signal $S_1$ has a value 1. Otherwise the output signal has a value 0. The sample and hold unit now can sample these 0's and 1's. Also the phase detector $PD_1$ can be implemented digitally, so that it can be simpler and work at higher frequencies.

The bit decision unit is able to use the phase signal $PH_1$ to produce the digital signal which is synchronous in relation to the channel bits, thereby being able to use the clock signal $C_1$ to output the digital signal. The sample and hold unit is capable of holding n samples. This unit is read out every cycle of clock signal $C_1$, and during each cycle of clock signal $C_1$ there are n cycles of clock signal $C_2$. The n samples comprise a number of channel bits which number is dependent on the ratio of the channel bit frequency and the frequency of clock signal $C_2$. For instance, if the frequency of clock signal $C_2$ is approximately equal to the channel bit frequency, then the n samples comprise n channel bits. If the frequency of clock signal $C_2$ is one and a half times the channel bit frequency, then the n samples comprise 2n/3 channel bits. If, with this ratio, n equals 3, then 3 samples contain 2 channel bits.

So, one sample may contain a duplicate value of a channel bit which is already represented by an other sample. If the phase difference exceeds a predetermined value, then the corresponding sample is the sample that may contain a duplicate value and the bit decision unit may decide not to output that sample in the digital signal. The decision not to output a sample will hereinafter also be referred to as discarding a sample. Because the amplitude of the processed signal represents the phase difference, it can be determined from the processed signal which sample to discard. Because the digital phase locked loop locks to the processed signal, also signal $PH_1$ may be used for determining which sample to use and which sample to discard. Initial, the phase difference and thus the amplitude of $PH_1$ may start from zero. When the amplitude exceeds a predetermined value then a corresponding sample may be discarded. The corresponding sample may be the sample closest to the point in time where the predetermined value is crossed. After that crossing, every time a multiple of the predetermined value is crossed, a corresponding sample may be discarded.

If the frequency of clock signal $C_2$ is approximately equal to the channel bit frequency, then the frequency of the processed signal is relatively low. Then also $PH_1$ has a relatively low frequency. Because the amplitude of $PH_1$ is only known at sampling instants determined by clock signal $C_1$, the amplitudes of $PH_1$ corresponding to the samples of $S_1$ have to be determined, e.g. by interpolating the amplitude at the n sampling instants. This results in the amplitude of $PH_1$ at n points between each cycle of clock signal $C_1$. If the amplitude of $PH_1$ at one of the n points exceeds a multiple of the predetermined value, then the corresponding sample of $S_1$ may be discarded.

If the frequency of $PH_1$ is relatively low, then the moments at which the amplitude of $PH_1$ exceeds a multiple of the predetermined value are relatively rare. This results in almost every sample of $S_1$ being outputted into the digital signal. This is the desired result, because when the frequency of $PH_1$ is relatively low, the frequency of the clock signal $C_2$ and the channel bit rate is approximately the same. If those frequencies are exactly the same, then all samples are outputted.

If the frequency of $PH_1$ is relatively high, then the moments at which the amplitude of $PH_1$ exceeds a multiple of the predetermined value are relatively frequent. This results in a smaller number of samples of $S_1$ being outputted into the digital signal between two subsequent cycles of clock signal $C_1$.

If n equals one, then the analog to digital converter ADC samples at the same speed as the analog to digital converter ADC of the known bit detection arrangement. Thus when n equals one the objective of the invention is not achieved. The clock signal that is fed to the digital phase locked loop DPLL and the bit decision unit does not explicitly has to be clock signal $C_1$. A clock signal that fulfills the Nyquist criterion for the processed signal will suffice. Because clock signal $C_2$ always has a higher rate than clock signal $C_1$, clock signal $C_2$ may be used instead of clock signal $C_1$ in case of the digital phase locked loop DPLL and the bit decision unit.

In an embodiment n is equal to eight. Because many digital systems work with units of eight bits this embodiment is relatively easy implementable. However n can have other values, provided that n is an integer. If n equals one, then the bit-detection arrangement does not fulfill the object of the invention, because the ADC has to sample at a relatively high rate. Common values of n are powers of 2, e.g. 16, 64, 128 or 256.

It follows from the previous paragraphs that for deriving the digital signal from the analog signal, the analog to digital converter ADC does not have to sample at a rate equal to or greater than the channel bit rate. A lower rate than the channel bit rate suffices because the phase signal $PH_2$ has a relatively low frequency. In the known bit-detection arrangement on the contrary, the analog to digital converter ADC has to sample at a relatively high rate, in order to satisfy the Nyquist criterion.

In an embodiment of the arrangement according to the invention the phase signal $PH_1$ comprises n components indicating which of the n samples is valid at a moment indicated by the clock signal $C_1$, n having the aforementioned value. The digital phase locked loop DPLL may generate the n components in a same manner as described in previous paragraphs, i.e. by interpolating the phase signal $PH_1$ and determine whether the amplitude of $PH_1$ has exceeded a multiple of the predetermined value.

In a favorable embodiment the amplitude of the output signal $PH_2$ is inversely proportional to the phase difference $\Delta P_1$, and the phase locked loop DPLL comprises:

a phase detector $PD_2$ able to generate a phase difference signal $\Delta P_2$ which is indicative for a phase difference between the processed signal and a feedback signal;

an integrating low pass filter able to produce a filtered signal by filtering the phase difference signal $\Delta P_2$;

n discrete time oscillators $DTO_{x=1}$ to $DTO_{x=n}$, each DTO comprising:

a multiplicator able to produce a multiplied signal which is a multiplication of the filtered signal (Fs) with a factor x equal to the index x of the DTO, and a summator able to produce a summated signal $SUM_x$ which is a summation of the multiplied signal and the feedback signal;

a truncation unit able to produce a truncated signal by resetting all bits in a bit presentation of the summated signal $SUM_n$ which are more significant than k least significant bits in the bit presentation, and able to produce the n components of the phase signal $PH_1$ wherein a first component has a value 1 if bit k+1 in a bit presentation of a sample of the summated signal $SUM_1$ has a value other than bit k+1 in a bit presentation of an immediately preceding sample of the summated signal $SUM_n$, indicating that $sample_{y=1}$ is valid, and wherein an xth component, where x is greater than 1, of the phase signal has a value 1 if bit k+1 in a bit presentation of the summated signal $SUM_x$ has a value other than bit k+1 in a bit presentation of the summated signal $SUM_{x-1}$, indicating that $sample_{y=x}$ is valid, and a buffer able to produce the feedback signal by holding the value of the truncated signal for one clock period of the clock signal $C_1$.

The DPLL is able to synchronize the feedback signal with the processed signal. If the clock signal $C_2$ has a frequency approximately the same as the channel bit frequency, then all the samples may be outputted in the digital signal, i.e. all samples are valid. This means that bit k+1 in the bit presentation of the summated signal $SUM_1$ differs from bit k+1 in the bit presentation of the summated signal $SUM_n$ of one clock period of clock signal $C_1$ ago, and that bit k+1 in the bit presentation of the summated signal $SUM_x$, where x is greater than 1, differs from bit k+1 in the bit presentation of the summated signal $SUM_{x-1}$ of all the summated signals. In this situation the filtered signal has a value approximately equal to the value represented by bit k+1 in the bit presentations of the summated signals, so that bit k+1 alternates between the bit presentations of the subsequent summated signals.

If the channel bit frequency decreases, then the frequency of the processed signal increases. At the sampling moment of clock signal $C_1$ the amplitude of the processed signal decreases because the signal is inversely proportional to the phase difference $\Delta P_1$. Consequently the amplitude of the feedback signal decreases too. This is accomplished by lowering the value of the filtered signal. Because the filtered signal is lowered, at some time bit k+1 of the bit presentation of a summated signal $SUM_x$ is has the same value as bit k+1 of the summated signal $SUM_{x-1}$. This bit is not valid and is not outputted in the digital signal.

If the digital PLL is in lock, then the phase difference signal $\Delta P_2$ has a near zero value. Because of the integrating effect in the integrating low pass filter the filtered signal preserves its value, thereby preserving the frequency of the feedback signal.

The interpolation described before is in this embodiment in fact performed by the n discrete time oscillators $DTO_{x=1}$ to $DTO_{x=n}$.

In an example n is equal to eight, and at one sampling instant bits k+1 of the signals $SUM_1$ to $SUM_8$ are:

$SUM_1=0$, $SUM_2=1$, $SUM_3=0$, $SUM_4=0$,
$SUM_5=1$, $SUM_6=0$, $SUM_7=1$, $SUM_8=0$.

In this case bit k+1 has the same values when comparing $SUM_3$ and $SUM_4$. This implies that the $sample_{y=4}$ may be discarded.

If the phase difference signal $\Delta P_2$ changes slowly then the feedback signal changes quickly and bit k+1 of the summated signals $SUM_x$ more frequently toggles. This is a logical outcome, because if the phase difference signal $\Delta P_2$ has a low frequency, then the frequency of the clock signal $C_2$ is approximately equal to the channel bit frequency, and thus almost every sample may be outputted. If the phase difference signal $\Delta P_2$ changes more quickly then the feedback signal changes more slowly and bit k+1 of the summated signals $SUM_x$ less frequently toggles. In this case the frequency of the clock signal $C_2$ is higher than the channel bit frequency, and some samples may be discarded. The samples in the sample and hold unit can be clocked out parallel using the clock signal $C_1$. In that case clock signal $C_2$ is used as clock signal $C_3$. The digital signal DS then comprises the n samples in the sample and hold unit. The digital signal DS also comprises the n components of phase signal $PH_1$ to indicate which of the n samples are valid. Alternatively, the n samples of the sample and hold unit may be clocked out serial using clock signal $C_3$, where clock signal $C_3$ is obtained by serializing the n components of phase signal $PH_1$ within the clock period of clock signal $C_1$.

A further embodiment further comprises:
a voltage controlled oscillator able to produce the clock signal $C_2$ having a frequency dependent on a VCO voltage, and
a frequency detector able to produce the VCO voltage dependent on a frequency of a signal chosen from output signal $S_1$, output signal $PH_2$ and the processed signal, the frequency detector being designed to handle the chosen signal.

Because in this embodiment the frequency of the clock signal $C_2$ is related to the frequency of output signal $S_1$, output signal $PH_2$ or the processed signal, and thus also to the channel bit frequency, the number of bits in the digital signal is held constant. If the frequency of the clock signal $C_2$ is approximately equal to the channel bit frequency, all the samples can be outputted in the digital signal every clock cycle of clock signal $C_1$. If output signal $S_1$ is used, then the frequency measured is directly the channel bit rate and the frequency of the VCO can be established accordingly. Also, the frequency detector and the VCO can operate in the analog domain. When using output signal $PH_2$ then the measured frequency is a measure of the frequency difference between the clock signal $C_2$ and the channel bit rate. The VCO is controlled to minimize this difference. Here, also the frequency detector and the VCO can operate in the analog domain. If the processed signal is used, then again the measured frequency is the frequency difference between the clock signal $C_2$ and the channel bit rate. The processed signal is however a digital signal, so the frequency detector in this case is designed to handle digital signals.

In a still further embodiment the bit-detection arrangement further comprises location determining means able to output a location signal which is indicative for relative positions of locations where the output signal $S_1$ crosses a predetermined level $L_1$ and where the clock signal $C_2$ crosses a predetermined level $L_2$, and the bit decision unit is able to use the location signal to determine if a sample may be toggled.

Because the phase of clock signal $C_2$ is not locked to the phase of the output signal $S_1$, the sample and hold unit may take samples which have an other value than the corresponding channel bit. This situation could occur around so called zero crossings. A zero crossing is the point where the amplitude of an AC-signal has a zero value. If the signal also has an DC component, then the zero crossing is defined as the point where the amplitude of the signal has a value of that DC-component. In this embodiment the zero crossings are determined by comparing the signals with the predetermined levels $L_1$ and $L_2$.

The phase difference between clock signal $C_2$ and output signal $S_1$ can be so great that the sample and hold unit samples at an area around zero crossing. In the following example presume that clock signal $C_2$ lags the output signal $S_1$, meaning that the sampling moments are later in time than the timing of the channel bits. If the clock signal $C_2$ indicates to the sample and hold unit to sample before the zero crossing of the output signal $S_1$, then the sample has a correct value in relation to the corresponding channel bit. If, however, the clock signal $C_2$ indicates that the sample and hold unit samples after the zero crossing of the output signal $C_2$, then the sample has an other value than the corresponding channel bit. This sample may be toggled in order for it to have a correct value.

When a bit may be toggled, the location signal has a value indicating this. The bit decision unit then may toggle the corresponding sample.

In an embodiment of the bit-detection arrangement the preprocessing unit comprises first conversion means for:
generating a first converted signal which is derived from the output signal $PH_2$ by removing steep transitions by switching between an inverting and an non-inverting state when the phase difference $\Delta P_1$ exhibits a steep phase change;
feeding the converted signal to the analog to digital converter ADC, and
outputting a control signal that indicates the phase changes, and in that the digital phase locked loop DPLL further comprises second conversion means which is able to generate a second converted signal which is derived from the processed signal $P_rS$ by adding steep transition by switching between an inverting and an non-inverting state by using the control signal.

In previous embodiments the output signal $PH_2$ exhibits a steep transition when the phase difference $\Delta P_1$ goes from 359 degrees to 0 degrees. This transition sets high demands on the performance of the analog to digital converter ADC. The first conversion means take away the steep transitions. Therefore the demands on the analog to digital converter ADC can be relaxed. The second conversion means puts back the transitions so that further processing by the digital phase locked loop DPLL can be the same as in previous embodiments.

The second object of the invention is realized in that the apparatus for reproducing information recorded on an information carrier is provided with the bit-detection arrangement according to the invention.

Such an apparatus generally also comprises:
- a read head able to read information from the information carrier;
- a displacement means able to cause a relative displacement between the information carrier and the read head;
- a signal processing unit able to process a signal coming from the read head into the analog signal;
- a channel decoding means able to decode the digital signal.

The apparatus for reproducing information on an information carrier is able to use a bit-detection arrangement having an analog to digital converter with a relative slow sampling rate.

These and other aspects of the bit-detection arrangement and of the apparatus for reproducing information according to the invention will be apparent from and elucidated by means of the drawings, in which:

FIG. 2a shows an example of the analog signal;

FIG. 2b shows a signal that represents the channel bit rate in the example of FIG. 2a;

FIG. 2c shows the clock signal $C_2$ in the example of FIG. 2a;

FIG. 2d shows the output signal $PH_2$ in the example of FIG. 2a;

FIG. 3 shows an example of the processed signal in relation to the clock signals $C_1$ and $C_2$;

FIG. 5a shows an example of the feedback signal in relation to the processed signal;

FIG. 5b shows another example of the feedback signal in relation to the processed signal;

FIG. 10a shows an example of the phase difference $\Delta P_1$;

FIG. 10b shows the output signal $PH_2$ when using the first inverting means in case of the phase difference $\Delta P_1$ shown in FIG. 10a;

FIG. 10c shows an example of the control signal in case of the phase difference $\Delta P_1$ shown in FIG. 10a, and FIG. 11 shows an embodiment of an apparatus for reproducing information provided with a bit-detection arrangement of the invention.

Figure 1:
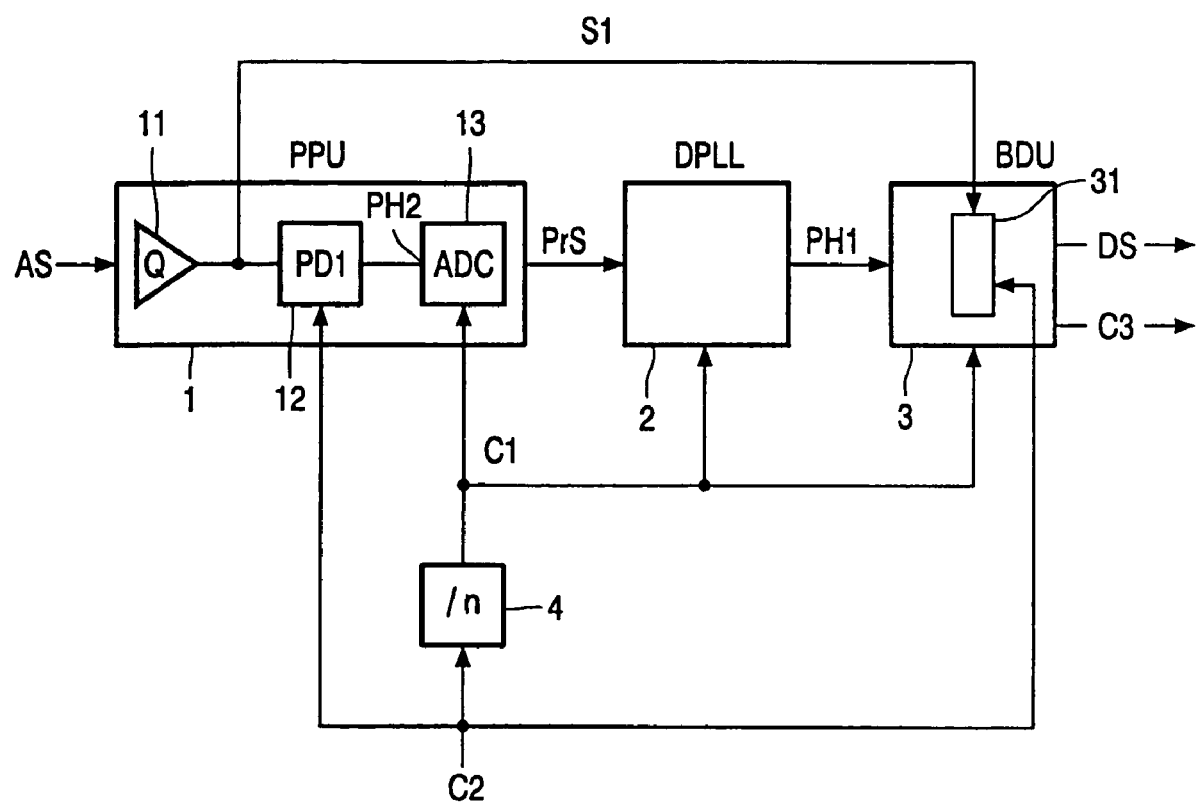
FIG. 1 shows an embodiment of the bit-detection arrangement according to the invention.

In the embodiment of the bit-detection arrangement shown in FIG. 1 the analog signal AS is converted into the processed signal PrS by the preprocessing unit 1. The digital phase locked loop DPLL 2 locks on to the processed signal PrS and outputs a phase signal $PH_1$. The bit decision unit outputs the digital signal DS and the clock signal C3 using the phase signal $PH_1$, the clock signal $C_1$ and the output signal $S_1$. The clock divider 4 produces the clock signal $C_1$ by dividing the frequency of clock signal $C_2$ by a factor n. The quantizer 11 quantizes the amplitude of the analog signal AS and outputs the resulting signal $S_1$. The phase detector $PD_1$ 12 determines the phase difference $\Delta P_1$ between the output signal $S_1$ and the clock signal $C_2$ and feeds the output signal $PH_2$ to the ADC. The ADC then samples the output signal $PH_2$ at a rate controlled by the clock signal $C_1$. The sample and hold unit 31 samples the output signal $S_1$ to obtain binary samples using the clock signal $C_2$. At the end of a clock cycle of clock signal $C_1$ the sample and hold unit 31 contains n samples. The bit decision unit may output all these samples at the beginning of the next cycle of clock signal $C_1$, or it outputs a smaller selection of these samples. Some samples may be discarded.

In FIG. 2a the analog signal AS 5 is shown together with a level 8. In the next example an embodiment of the quantizer 11 is a threshold detector. A threshold detector interprets samples as a logic 1 if the value of the sample is above a predetermined level, and as a logic 0 if the value of the sample is under a predetermined level. The level 8 shown in FIG. 2a is the predetermined level. The sampling moments of clock signal $C_2$ are indicated by the circles 6. The sampling moments of the original data is indicated by the crosses 7. In FIG. 2b the rising edges of the pulses indicate the sampling moments corresponding to the crosses 7, i.e. this signal represents the channel bit rate. The rising edges of the pulses in FIG. 2c indicate the sampling moments corresponding to the circles 6, i.e. this signal represents the clock signal $C_2$.

The channel bits contained in the analog signal AS of FIG. 2a are 1111 0001. The data that the sample and hold unit contains after sampling the output signal $S_1$ is 1111 1 0001. It is clear that one channel bit is sampled twice. In this case the fifth bit, i.e. $sample_{y=5}$, that the sample and hold unit 31 contains, may be discarded.

Further in FIG. 2d it is apparent that the output signal $PH_2$, indicated by the solid line, has a relatively low frequency compared to the channel bit rate. The ADC 13 may sample at a relatively low rate. The output signal $PH_2$ is noisy because of disturbance in the clock signal $C_2$ and because the phase difference $\Delta P_1$ does not exactly have a linear course. Therefore also the processed signal $P_rS$ is noisy because it is a sampled version of the output signal $PH_2$. The digital PLL 2 smoothens the processed signal $P_rS$ in order to oppress these disturbances.

As can be seen from the FIGS. 2a to 2d, at a first point the phase difference between the clock signal $C_2$ and the channel bit rate becomes so great that one channel bit is sampled twice. This first point corresponds to a second point at which the amplitude of the output signal $PH_2$ crosses a predetermined value. Because ADC 13 samples at a clock cycle which is n times slower than the clock cycle of clock signal $C_2$, it is not clear from the processed signal PrS which of the n samples that the sample and hold unit 31 contains may be discarded. As shown in FIG. 3 however, the processed signal PrS may be interpolated to obtain information about which sample may be discarded. The first sample corresponding to the interpolation that is greater than the predetermined level L, may be discarded. A next sample may be discarded that has a corresponding interpolation that is greater than twice the predetermined value L. If the processed signal PrS at some point returns to zero, than of course the criterion for discarding the next sample is crossing the predetermined level L. In FIG. 3 $C_1$ and $C_2$ are the cycles of the corresponding clock signals. If the embodiment of the digital PLL 2 outputs a similar signal as the processed signal PrS, then instead of the processed signal PrS also the phase signal $PH_1$ may be used. In that case the interpolation may be done by the bit detection unit 3.

Figure 4:
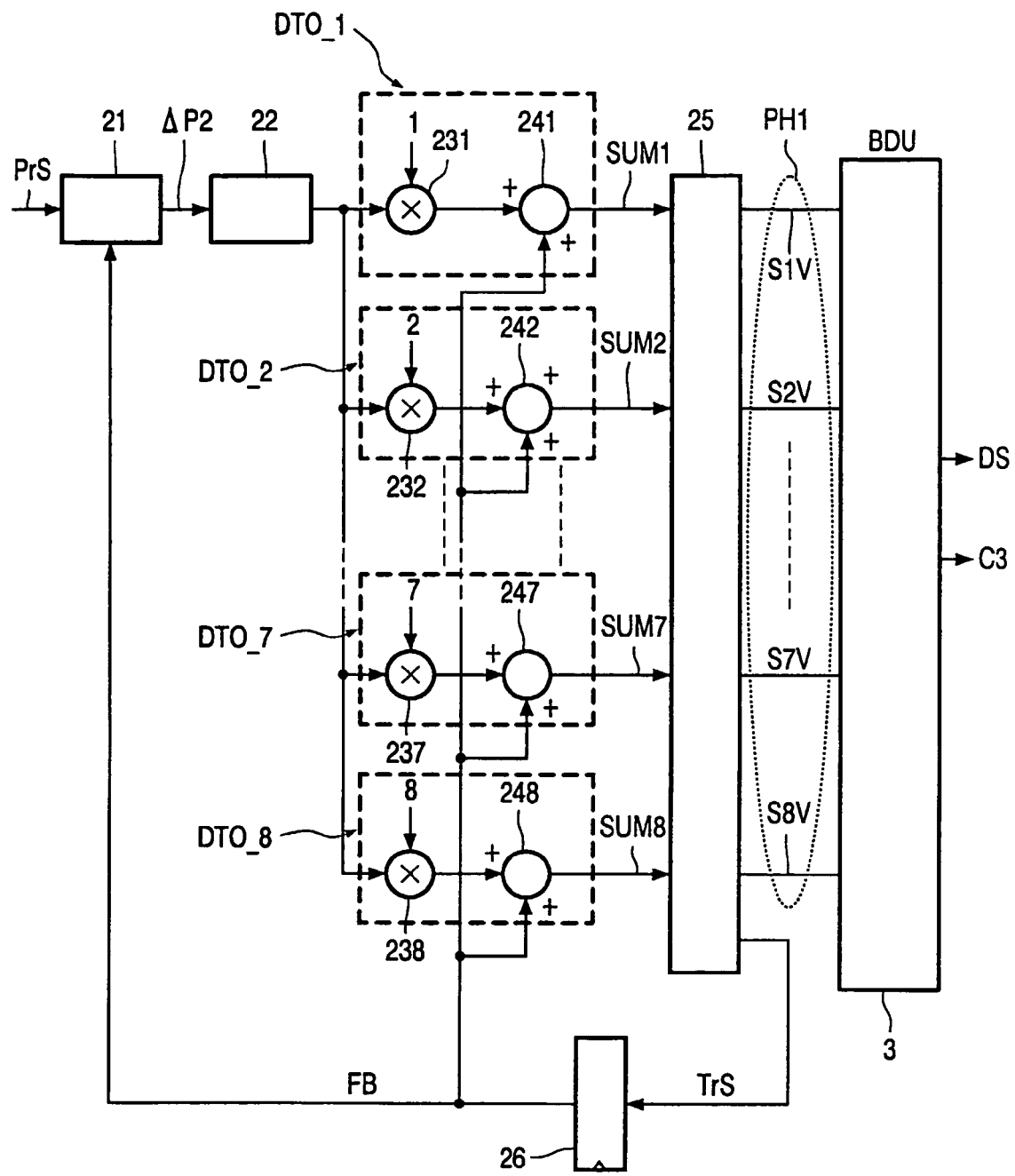
FIG. 4 shows an embodiment of a DPLL which is able to output a phase signal $PH_2$ which comprises 8 components indicating which of the 8 samples is valid.

In FIG. 4 the phase detector 21 outputs a phase difference signal $\Delta P_2$ which is filtered by the integrating low pass filter 22. The filtered signal FS is fed to the multiplicators 231 to 238. The multiplied signals are fed to the summators 241 to 248. The summated signals $SUM_1$ to $SUM_8$ are then fed to the truncator 25. The summated signal $SUM_8$ is truncated by the truncator and then fed as the truncated signal $T_rS$ to the buffer 26. Truncating in this context means resetting all bits in a bit presentation of the summated signal $SUM_8$ which are more significant than k least significant bits in the bit presentation. If the summated signal $SUM_8$ of DTO_8 has a value of decimal 83, then a bit presentation of that sample of 8 bits is 0101 0011. If k equals 4 than the truncated signal $T_rS$ sample equals 0000 0011, which represents decimal 3. The truncated signal $T_rS$ is clocked into the buffer by clock signal $C_1$, and outputted as the feedback signal FB for one clock cycle of $C_1$. The feedback signal FB is added to the multiplied signals by the summators 241 to 248. Also the phase of the feedback signal FB is compared to the phase of the processed signal PrS by the phase detector 21. The phase signal $PH_1$ contains 8 components $S_1V$ to $S_8V$. The signals $S_1V$ to $S_8V$ indicate which of the 8 samples is valid at a moment indicated by the clock signal $C_1$. Hereinafter a value 1 of these signals indicate that the corresponding sample is valid and may be outputted in the digital signal DS.

In FIG. 5a an example of the processed signal $P_rS$, the feedback signal FB and a signal representing the channel bit frequency ChBf are shown, whereby n equals 8. On the horizontal axis periods of clock signal $C_1$ and clock signal $C_2$ are inserted. The feedback signal FB and the processed signal $P_rS$ are clocked with clock signal $C_1$. Clock signal $C_2$ is included for illustration purposes. In this example the clock signal $C_2$ has a slightly higher frequency than the channel bit frequency ChBf. As a result, the processed signal $P_rS$ is varying relatively slowly. At every clock period of clock signal $C_1$ the feedback signal FB is buffered. The phase detector $PD_2 21$ tries to synchronize the feedback signal FB with the processed signal $P_rS$ If that is the case, then the momentary amplitude of the feedback signal FB is substantially equal to the amplitude of the processed signal $P_rS$. Because almost all samples obtained by the sample and hold unit 31 may be outputted in the digital signal DS, bits k+1 of subsequent summated signals $SUM_x$ are alternating. This means that the filtered signal FS has a relatively high value. If for example bit k+1 represents a decimal value of 256, then the filtered signal FS has a value of approximately 250. This causes bit k+1 of subsequent summated signals $SUM_x$ to alternate, and the signals $S_1V$ to $S_8V$ have a value 1, indicating all the samples may be outputted.

In FIG. 5b the channel bit frequency ChBf is substantially lower than the channel bit frequency ChBf of the example shown in FIG. 5a. This causes the processed signal $P_rS$ to vary more quickly. As a consequence the frequency of the feedback signal FB decreases in order to synchronize the feedback signal FB with the processed signal $P_rS$. The filtered signal FS is decreased in order to decrease the frequency of the feedback signal FB. The filtered signal FS may, for instance, have a value of 200. At one point bit k+1 of subsequent summated signals $SUM_x$ does not alternate, and the corresponding sample is not outputted.

Figure 6:
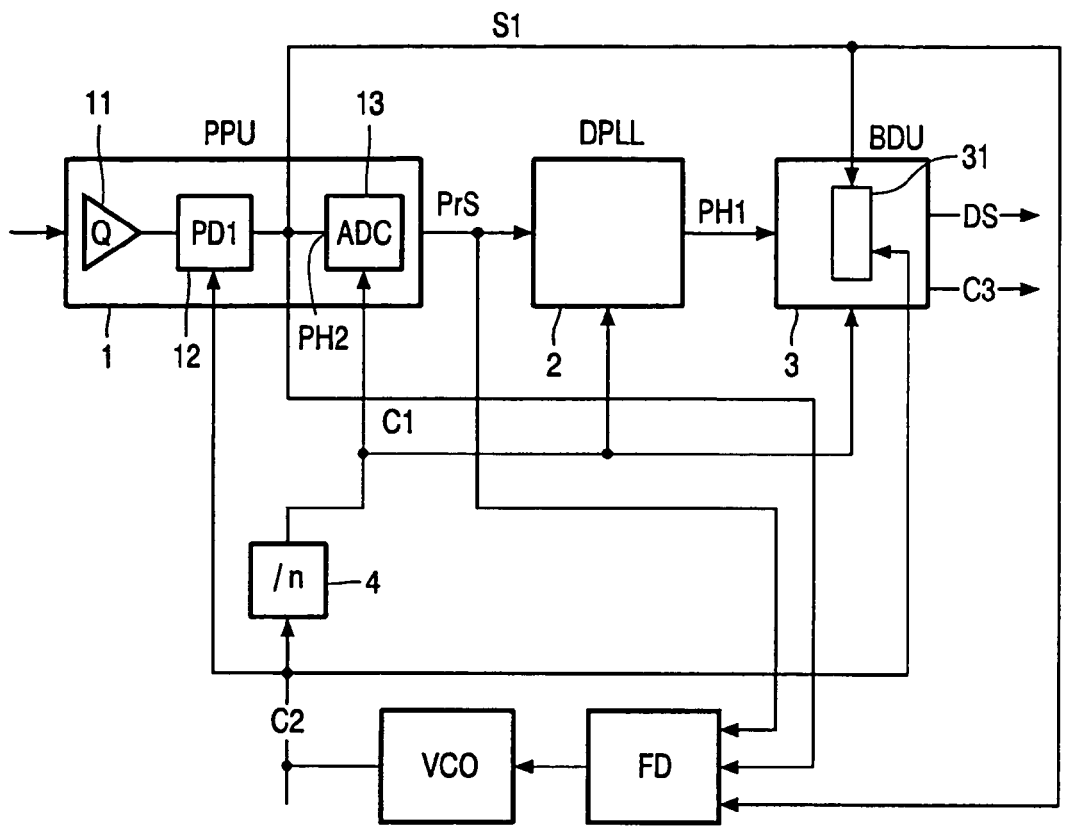
FIG. 6 shows possible embodiments of the bit-detection arrangement comprising a frequency detector and a voltage controlled oscillator.

In the embodiment depicted in FIG. 6 the clock signal $C_2$ is produced by the voltage controlled oscillator VCO. The frequency detector produces the VCO voltage as a function of the frequency of the output signal $PH_2$, or the frequency of the processed signal PrS, or the frequency of the output signal $S_1$. The voltage controlled oscillator VCO and the Frequency detector FD of an embodiment using the frequency of the output signal $PH_2$ or the output signal $S_1$ can be implemented with analog electronics. The frequency detector FD of an embodiment using the processed signal PrS, is preferably implemented digitally, because the processed signal PrS is digital. Also the relation between the VCO voltage and the frequency of the input signal of the frequency detector FD is dependent on the signal used as the input signal of the frequency detector FD. For instance, the output signal $S_1$ has a higher frequency than the processed signal PrS.

Figure 7:
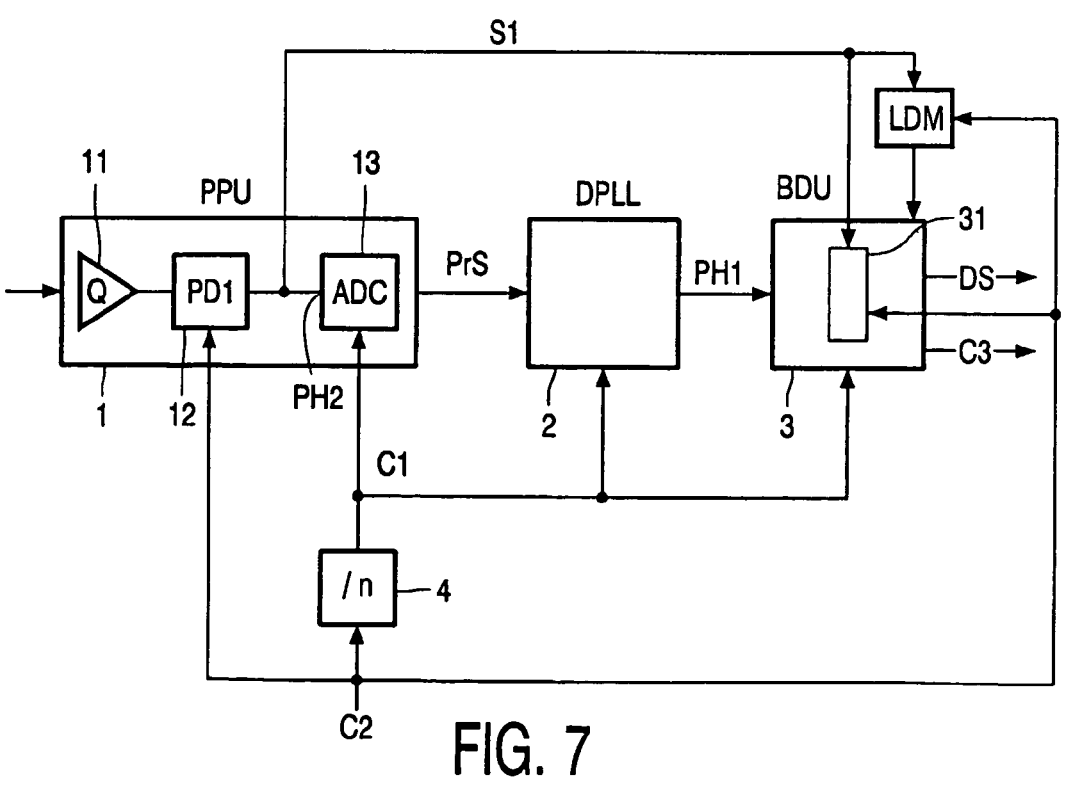
FIG. 7 shows an embodiment of the bit-detection arrangement comprising a location determining means.
Figure 8A:
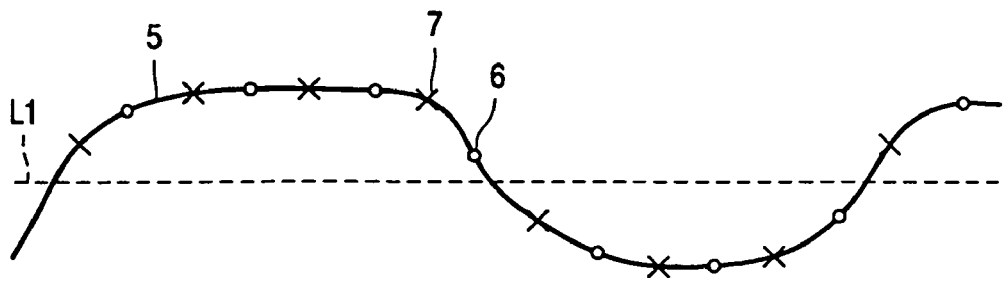
FIG. 8a shows an example of the output signal $S_1$ in relation to the sample moments of clock signal $C_2$, where a sample is taken before zero crossing.
Figure 8B:
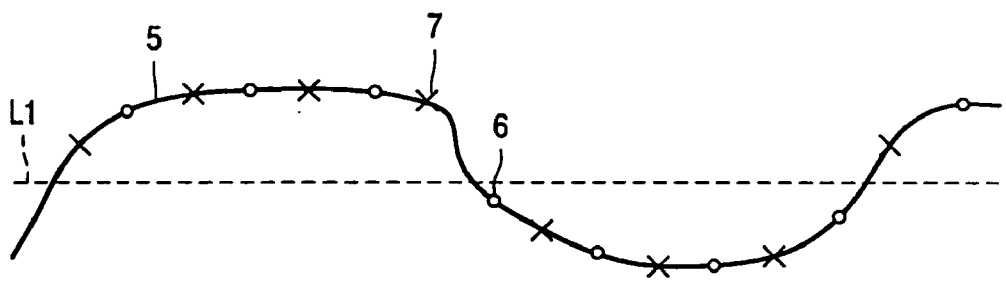
FIG. 8b shows an example of the output signal $S_1$ in relation to the sample moments of clock signal $C_2$, where a sample is taken after zero crossing.

The location determining means LDM in FIG. 7 is able to determine the location of the zero crossing of the output signal $S_1$ and the location of the zero crossing of the clock signal $C_2$. If, as indicated in FIG. 8a, the sample 6 is taken just before the zero crossing of the output signal $S_1$, then the value of the sample is 1. The corresponding channel bit 7 also has a value 1, so the sample has the correct value. If, as indicated in FIG. 8b, the sample 6 is taken just after the zero crossing of the output signal, then the value of the sample is 0. The value of the sample is thus incorrect and may be toggled. The location signal may indicate to the bit decision unit to toggle this sample. The location signal can for instance be a bit-stream with the same frequency as clock signal $C_2$, but with value 0 if the corresponding bit is preferably not to be toggled and a value 1 if the corresponding bit is preferably to be toggled.

Figure 9:
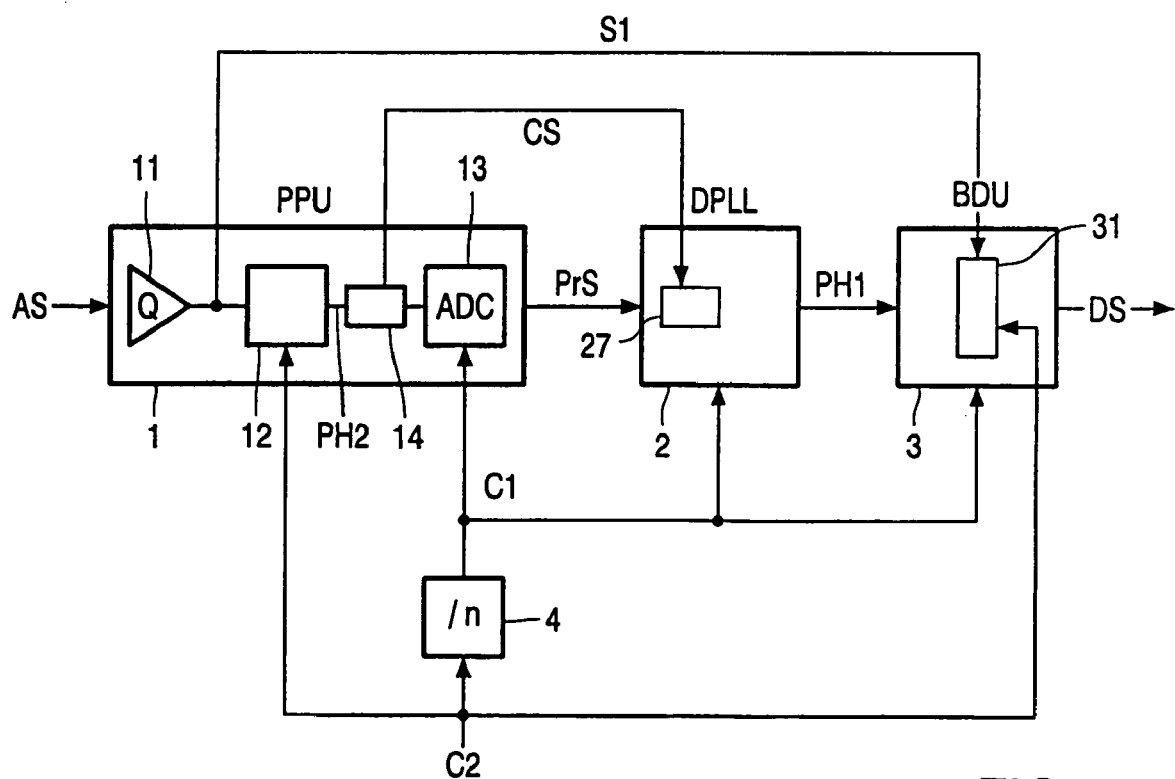
FIG. 9 shows an embodiment of the bit detection arrangement using inverting means.

In FIG. 9 the output signal $PH_2$ is fed to an input of the first conversion means 14. The first inverted signal $CvS_1$ is fed to the analog to digital converter ADC 13. Also a control signal CS is generated by the first conversion means 14. The control signal CS is fed to the second conversion means 27. The second conversion means 27 uses the control signal CS to put back the steep transitions.

In FIG. 10a the output signal $PH_2$ exhibits several steep transitions. Between point P1 and point P2, as shown in FIG. 10b, the output signal $PH_2$ is inverted, thereby removing the two steep transitions at the points P1 and P2. Also a control signal CS is generated as can be seen in FIG. 10c. In this example the control signal CS contains pulses at the steep transitions. The second conversion means 27 operate in a similar manner.

In FIG. 11 the displacement means 200 displaces the information carrier 100 relative to the read head 300. The signal processing unit 400 converts a signal coming from the read head 300 into the analog signal AS. The read head 300 could for instance be a laser unit and a detector for detecting a laser beam reflected by the surface of the information carrier 100. The detector can contain four sub-detection areas. The signal processing unit 400 then performs a summation operation to the signals coming from the sub-detection areas. The analog signal AS is subsequently converted to the digital signal DS by the bit detection arrangement 500 of the invention. Following that conversion, the channel decoding means 600 further decodes the digital signal DS. The digital signal DS can for instance be a EFM coded signal.

The invention claimed is:
1. A bit-detection arrangement able to convert an analog signal having an amplitude into a digital signal representing a bit sequence from which the analog signal is derived, the bit-detection arrangement comprising:
    a preprocessing unit able to convert the analog signal into
        a processed signal suitable for further processing and able to produce a first output signal, the preprocessing unit comprising an analog to digital converter which is able to output the processed signal at a sample rate controlled by a first clock signal;
    a digital phase locked loop able to lock on the processed signal and able to output a phase signal using the first clock signal;

a clock divider able to use a second clock signal to produce the first clock signal by dividing a frequency of the second clock signal by a factor n, where n is an integer greater than one, a bit decision unit able to output the digital signal and a third clock signal using the phase signal, the first clock signal, the second clock signal and the first output signal; and the preprocessing unit further comprising:

a quantizer able to produce the first output signal by quantizing the amplitude of the analog signal, and a phase detector able to determine a phase difference between the first output signal and the second clock signal, and able to feed a second output signal having an amplitude to the analog to digital converter, where the amplitude of the second output signal indicates the phase difference, and the bit decision unit comprising a sample and hold unit able to sample the first output signal, using the second clock signal, and to hold n samples, $sample_{y=1}$ to $sample_{y=n}$, of the first output signal for a clock period of the first clock signal, n being a division factor of the second clock signal.

2. The bit-detection arrangement as claimed in claim 1, wherein the phase signal comprises n components indicating which of the n samples is valid at a moment indicated by the first clock signal.

3. The bit-detection arrangement as claimed in claim 2, wherein the phase detector is a first phase detector, wherein the phase difference signal is a first phase difference signal, and wherein the amplitude of the second output signal is inversely proportional to the phase difference, and the phase locked loop comprises:

a second phase detector able to generate a second phase difference signal which is indicative of a phase difference between the processed signal and a feedback signal;

an integrating low pass filter able to produce a filtered signal by filtering the second phase difference signal;

n discrete time oscillators $DTO_{x=1}$ to $DTO_{x=n}$, each discrete time oscillator comprising:

a multiplicator able to produce a multiplied signal which is a multiplication of the filtered signal with a factor x equal to the index x of the discrete time oscillator, and a summator able to produce a summated signal $SUM_x$ which is a summation of the multiplied signal and the feedback signal;

a truncation unit able to produce a truncated signal by resetting all bits in a bit presentation of the summated signal $SUM_n$ which are more significant than k least significant bits in the bit presentation, and able to produce the n components of the phase signal wherein a first component has a value 1 if bit k+1 in a bit presentation of a sample of the summated signal $SUM_1$ has a value other than bit k+1 in a bit presentation of an immediately preceding sample of the summated signal $SUM_n$, indicating that $sample_{y=1}$ is valid, and wherein an xth component, where x is greater than 1, of the phase signal has a value 1 if bit k+1 in a bit presentation of the summated signal $SUM_x$ has a value other than bit k+1 in a bit presentation of the summated signal $SUM_{x-1}$, indicating that $sample_{y=x}$ is valid, and a buffer able to produce the feedback signal by holding a value of the truncated signal for one clock period of the first clock signal.

4. The bit-detection arrangement as claimed in claim 1, further comprising:

a voltage controlled oscillator able to produce the second clock signal having a frequency dependent on a voltage controlled oscillator voltage, and a frequency detector able to produce the voltage controlled oscillator voltage dependent on a frequency of a signal chosen from the first output signal, the second output signal and the processed signal, the frequency detector being designed to handle the chosen signal.

5. The bit-detection arrangement as claimed in claim 1, further comprising location determining means able to output a location signal which is indicative for relative positions of locations where the first output signal crosses a first predetermined level and where the second clock signal crosses a second predetermined level, and the bit decision unit is able to use the location signal to determine if a sample may be toggled.

6. The bit-detection arrangement as claimed in claim 1, wherein n is equal to eight.

7. The bit-detection arrangement as claimed in claim 1, wherein the preprocessing unit comprises first conversion means for:

generating a first converted signal which is derived from the second output signal by removing steep transitions by switching between an inverting and an non-inverting state when the phase difference exhibits a steep phase change;

feeding the converted signal to the analog to digital converter, and outputting a control signal that indicates the phase changes, wherein the digital phase locked loop further comprises second conversion means which is able to generate a second converted signal which is derived from the processed signal by adding steep transition by switching between an inverting and an non-inverting state by using the control signal.

8. An apparatus for reproducing information recorded on an information carrier, utilizing the bit-detection arrangement as claimed in claim 1.

* * * * *